(12) United States Patent
Geller et al.

(10) Patent No.: US 9,684,744 B2
(45) Date of Patent: Jun. 20, 2017

(54) VERIFICATION OF SYSTEM ASSERTIONS IN SIMULATION

(71) Applicant: ROCKETICK TECHNOLOGIES LTD., Ramat Gan (IL)

(72) Inventors: Ishay Geller, Mikhmoret (IL); Guy Rom, Zichron Yaakov (IL); Shay Mizrachi, Hod-HaSharon (IL)

(73) Assignee: Rocketick Technologies LTD., Ramat Gan (IL)

( * ) Notice: Subject to any disclaimer, the term of this patent is extended or adjusted under 35 U.S.C. 154(b) by 0 days.

(21) Appl. No.: 14/883,661

(22) Filed: Oct. 15, 2015

(65) Prior Publication Data
US 2017/0109457 A1    Apr. 20, 2017

(51) Int. Cl.
    *G06F 17/50*    (2006.01)
(52) U.S. Cl.
    CPC .................. *G06F 17/5009* (2013.01)
(58) Field of Classification Search
    CPC ...... G06F 8/34; G06F 9/4436; G06F 17/5045; G06F 17/5022; G06F 21/10; G06F 21/572; G06F 21/71; G06F 21/725; G06F 21/73; G06F 21/86; G06F 2221/2135; G06F 17/30294; G06F 17/30572; G06F 17/5004
    USPC .................................................. 716/100–111
    See application file for complete search history.

(56) References Cited

U.S. PATENT DOCUMENTS

| | | | |
|---|---|---|---|
| 7,076,753 B2 | 7/2006 | Cerny et al. | |
| 7,143,373 B2 | 11/2006 | Moorby | |
| 7,188,061 B2 | 3/2007 | Beer et al. | |
| 7,386,813 B2 | 6/2008 | Singh et al. | |
| 7,711,536 B2 | 5/2010 | McNamara | |
| 7,712,060 B1 | 5/2010 | Garg et al. | |
| 7,797,123 B2 | 9/2010 | De et al. | |
| 7,810,056 B1 | 10/2010 | Garg et al. | |
| 7,958,475 B2 | 6/2011 | Khan | |
| 8,104,001 B2 | 1/2012 | Lehavot et al. | |
| 8,161,439 B2 | 4/2012 | Lim et al. | |
| 8,214,782 B1 | 7/2012 | Chakraborti et al. | |
| 8,234,617 B2 | 7/2012 | Chetput et al. | |
| 8,316,332 B1 | 11/2012 | Goyal et al. | |

(Continued)

OTHER PUBLICATIONS

IEEE Standard for SystemVerilog—Unified Hardware Design, Specification and Verification Language—IEEE Std 1800™—2012, 1315 pages, Feb. 21, 2013.

(Continued)

*Primary Examiner* — Binh Tat
(74) *Attorney, Agent, or Firm* — Mark H. Whittenberger, Esq.; Holland & Knight LLP

(57) ABSTRACT

A method for design verification includes receiving a definition of a design of an integrated circuit device and at least one assertion of a property that is to be verified over the design. The definition is compiled into a graph of processing elements, including first processing elements that simulate operation of the device and at least one second processing element representing the at least one assertion. The at least one second processing element includes a hierarchical arrangement of at least one operator node and one or more leaf nodes corresponding to inputs of the at least one assertion. A simulation of the design is executed by triggering the processing elements in the graph in multiple, consecutive clock cycles and evaluating the property during execution of the simulation.

21 Claims, 3 Drawing Sheets

(56) References Cited

U.S. PATENT DOCUMENTS

| | | |
|---|---|---|
| 8,401,828 B1 | 3/2013 | Bhattacharya et al. |
| 8,413,088 B1 | 4/2013 | Armbruster et al. |
| 8,448,112 B1 | 5/2013 | Kashai et al. |
| 8,516,454 B2 | 8/2013 | Mizrachi et al. |
| 8,527,936 B2 | 9/2013 | Jain et al. |
| 8,554,530 B1 | 10/2013 | O'Riordan et al. |
| 8,671,395 B1 | 3/2014 | Yuan et al. |
| 8,689,192 B2 | 4/2014 | Dargelas |
| 8,726,224 B1 | 5/2014 | Giangarra et al. |
| 8,751,211 B2 | 6/2014 | Tal et al. |
| 8,838,559 B1 | 9/2014 | O'Riordan et al. |
| 8,839,164 B2 | 9/2014 | Kavalipati et al. |
| 8,875,069 B1 | 10/2014 | Spacek |
| 8,904,321 B1 | 12/2014 | Cohen et al. |
| 8,904,332 B1 | 12/2014 | Neal et al. |
| 8,910,099 B1 | 12/2014 | Goyal et al. |
| 8,910,105 B1 | 12/2014 | Lawson et al. |
| 8,990,746 B1 | 3/2015 | Goyal et al. |
| 9,032,347 B1 | 5/2015 | O'Riordan et al. |
| 9,032,377 B2 | 5/2015 | Mizrachi et al. |
| 9,047,424 B1 | 6/2015 | Baker et al. |
| 9,087,166 B2 | 7/2015 | Tal et al. |
| 9,128,748 B2 | 9/2015 | Mizrachi et al. |
| 2007/0150846 A1* | 6/2007 | Furnish ............... G06F 17/5068 716/122 |
| 2008/0216038 A1* | 9/2008 | Bose ................... G06F 17/5072 716/118 |
| 2009/0254874 A1* | 10/2009 | Bose ................... G06F 17/5068 716/113 |
| 2014/0372967 A1 | 12/2014 | Armoni et al. |
| 2015/0186120 A1 | 7/2015 | Mizrachi et al. |
| 2015/0331713 A1 | 11/2015 | Mizrachi et al. |
| 2016/0019326 A1 | 1/2016 | Tal et al. |

OTHER PUBLICATIONS

IEEE Standard 1364-2001, "IEEE Standard Verilog® Hardware Description Language", Sep. 28, 2001.
IEEE Standard 1800-2009, "IEEE Standard for System Verilog—Unified Hardware Design, Specification, and Verification Language", Dec. 11, 2009.

* cited by examiner

VERIFICATION OF SYSTEM ASSERTIONS IN SIMULATION

COPYRIGHT NOTICE

A portion of the disclosure of this patent document contains material that is subject to copyright protection. The copyright owner has no objection to the facsimile reproduction by anyone of the patent document or patent disclosure, as it appears in the U.S. Patent and Trademark Office patent file or records, but otherwise reserves all copyright rights whatsoever.

FIELD OF THE INVENTION

The present invention relates generally to electronic design automation (EDA), and particularly to methods and apparatus for verification of assertions in design simulation.

BACKGROUND

EDA systems that are known in the art receive high-level behavioral descriptions of an integrated circuit (IC) device and translate them into netlists. The behavioral description is typically expressed in a hardware description languages, such as VHDL or Verilog®. The netlist describes the IC design as a graph, with nodes representing circuit elements and directed edges corresponding to signal lines between the nodes. The netlist can be used to synthesize the actual circuit layout in mask form. Before synthesis, however, the design is generally tested by constructing a software model of the netlist and verifying proper operation by computer simulation and/or formal verification techniques.

"Assertions" are commonly used in circuit design verification. An assertion, in the context of the present description and in the claims, is a statement that validates an assumption or checks a condition that applies to operation of the design being verified. Typically, an assertion is a statement that a certain property is required to be true, for example, that a read_request must always be followed by a read_grant within two clock cycles. Assertions form the basis for automated checking that specified properties are true, and can be used to generate automatic error messages when a given property is violated.

Industry organizations have defined standardized assertion languages that designers can use to specify their assertions, and vendors of EDA systems have developed automated checking tools that integrate these assertions into their simulation environments. For example, the SystemVerilog hardware description language defines SystemVerilog Assertions (SVAs), which can be used in testing circuit designs that are written using Verilog or SystemVerilog. SystemVerilog Assertions are defined and specified in Chapter 16 of the *IEEE Standard for SystemVerilog—Unified Hardware Design, Specification and Verification Language* (IEEE Std 1800™-2012, February 2013), which is incorporated herein by reference.

U.S. Pat. No. 7,143,373 describes methods and apparatus for evaluating and debugging assertions, including System-Verilog Assertions. Assertion expressions are evaluated against the binary signal values of a circuit simulation in such a way as to be able to report status information at intermediate levels of assertion subexpressions. In one embodiment, the status information reported for an intermediate subexpression contains the final status of that subexpression in response to a given assertion attempt, at least to the extent it has been determined by the end of the evaluation period (e.g., pass, fail or indeterminate). In another embodiment, the status information reported for an intermediate subexpression contains a tick-by-tick analysis of the activity within that subexpression. In another embodiment, the status information for a subexpression can also contain a tick-by-tick analysis of the activity of an operator of the subexpression. Other kinds and levels of detail at the subexpression level can be provided in various other embodiments.

U.S. Pat. No. 9,032,377, whose disclosure is incorporated herein by reference, describes a method for efficient parallel computation of dependency problems that can be used in design simulation. The method includes accepting a definition of a computing task, which includes multiple Processing Elements (PEs) having execution dependencies. The computing task is compiled for concurrent execution on a multiprocessor device, by arranging the PEs in a series of two or more invocations of the multiprocessor device, including assigning the PEs to the invocations depending on the execution dependencies. The multiprocessor device is invoked to run software code that executes the series of the invocations, so as to produce a result of the computing task. Further aspects of simulation using parallel processors in execution of processing elements are described in U.S. Pat. No. 9,087,166, whose disclosure is likewise incorporated herein by reference.

SUMMARY

Embodiments of the present invention that are described hereinbelow provide methods, systems and software for integrating assertions into simulation-based design verification.

There is therefore provided, in accordance with an embodiment of the invention, a method for design verification, which includes receiving a definition of a design of an integrated circuit device and at least one assertion of a property that is to be verified over the design. The definition is compiled into a graph of processing elements, including first processing elements that simulate operation of the device and at least one second processing element representing the at least one assertion. The at least one second processing element includes a hierarchical arrangement of at least one operator node and one or more leaf nodes corresponding to inputs of the at least one assertion.

A processor executes a simulation of the design by triggering the processing elements in the graph in multiple, consecutive clock cycles. The property is evaluated by performing the following steps on the processor, during execution of the simulation. The at least one operator node initiates in each clock cycle in a sequence of the clock cycles, one or more threads for execution by at least one of the leaf nodes. The threads are executed in each clock cycle, by the at least one of the leaf nodes, in order to evaluate a matching condition over the inputs. In each clock cycle, results of executing the threads in the clock cycle are reported from the at least one of the leaf nodes to the operator node. Based on the results reported by the at least one of the leaf nodes, an output is generated from the at least one operator node in each clock cycle, indicating whether the at least one assertion was satisfied.

In a disclosed embodiment, the at least one operator node corresponds to at least one operator, selected from a group of operators consisting of a concatenation operator, a repetition operator, and an implication operator.

Typically, the hierarchical arrangement includes a tree containing multiple operator nodes having respective child nodes, each child node including either a leaf node or another operator node.

In the disclosed embodiments, the at least one operator node includes an upper interface, which links the at least one operator node to another node above the at least one operator node in the hierarchical arrangement, and at least one child interface, which links the at least one operator node to an upper interface of a respective child node, wherein each of the upper and child interfaces includes a match method, and wherein reporting the results includes calling the match method to report, via the upper interface of the child node, that the matching condition has been satisfied on at least one of the threads executing on the child node in a given clock cycle.

In some embodiments, each of the upper and child interfaces includes a schedule method, and initiating the one or more threads includes calling the schedule method by the at least one operator node in order to schedule a thread to run on the child node. In one embodiment, calling the schedule method includes scheduling multiple, different threads with respective creation times to run concurrently on the child node, wherein a plurality of the threads have a common creation time and together report when the matching condition has been satisfied. Additionally or alternatively, calling the schedule method includes invoking the schedule method multiple times by multiple, different parent threads, running on the at least one operator node and having respective creation times, thereby causing multiple child threads to run concurrently on the child node, wherein the child threads have respective start times corresponding to the respective creation times of the parent threads.

Further additionally or alternatively, each of the upper and child interfaces includes a done method, and reporting the results includes calling the done method to report, via the upper interface of the child node, that execution of at least one of the threads running on the child node has been terminated. Typically, calling the done method with respect to a given thread without reporting that the matching condition has been satisfied on the given thread indicates that the matching condition has not been satisfied with respect to the given thread. In a disclosed embodiment, the method includes, in response to execution of the done method by the child node, instructing the child node, via the upper interface of the child node, to kill the given thread, thereby invoking a recursive process of killing multiple threads that propagates down through the graph.

There is also provided, in accordance with an embodiment of the invention, apparatus for design verification, including an interface, which is coupled to receive a definition of a design of an integrated circuit device and at least one assertion of a property that is to be verified over the design. A processor is configured to compile the definition into a graph of processing elements, including first processing elements that simulate operation of the device and at least one second processing element representing the at least one assertion. The at least one second processing element includes a hierarchical arrangement of at least one operator node and one or more leaf nodes corresponding to inputs of the at least one assertion. The processor is configured to execute a simulation of the design by triggering the processing elements in the graph in multiple, consecutive clock cycles, and to evaluate the property by performing on the processor, during execution of the simulation, the steps described above.

There is additionally provided, in accordance with an embodiment of the invention, a computer software product, including a non-transitory computer-readable medium in which program instructions are stored, which instructions, when read by a computer, cause the computer to receive a definition of a design of an integrated circuit device and at least one assertion of a property that is to be verified over the design, and to compile the definition into a graph of processing elements, including first processing elements that simulate operation of the device and at least one second processing element representing the at least one assertion, the at least one second processing element including a hierarchical arrangement of at least one operator node and one or more leaf nodes corresponding to inputs of the at least one assertion. The instructions cause the computer to execute a simulation of the design by triggering the processing elements in the graph in multiple, consecutive clock cycles, and to evaluate the property by performing on the processor, during execution of the simulation, the steps described above.

The present invention will be more fully understood from the following detailed description of the embodiments thereof, taken together with the drawings in which:

DETAILED DESCRIPTION OF EMBODIMENTS

Overview

Figure 1:
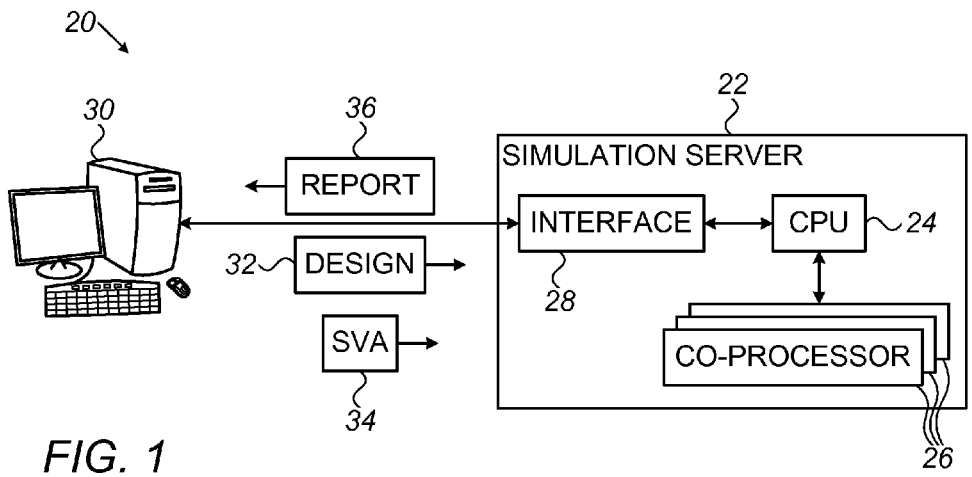
FIG. 1 is a block diagram that schematically illustrates a system for design simulation, in accordance with an embodiment of the invention.

Incorporation of assertions, such as SVAs, into simulation testing provides electronic circuit designers and test engineers with a powerful tool for verification of circuit properties. Actual implementation of the assertions in the simulation environment, however, can put a severe burden on the computers that are required to compile and run the simulation. Verifying even a simple assertion typically requires the computer to evaluate a number of variables and logical conditions at least once in every simulated clock cycle. As the design under test and the assertions that it must satisfy grow in complexity, the computer will often be required to maintain and evaluate multiple instances of each logical condition, over many different variables, in each clock cycle. The computing burden can become untenable, and reports that a given assertion was satisfied or violated may reach the operator belatedly if at all.

Embodiments of the present invention that are described herein provide a framework for integration of assertions into a simulation environment that enables fast, efficient evaluation of the assertion and reporting of verification results. The embodiments are based on decomposing assertions into a hierarchical graph, or tree, of processing elements, each processing element comprising an operator and one or more operands. This hierarchical structure is hidden inside verification processing elements. Externally, they are similar to the circuit processing elements that are described in the above-mentioned U.S. Pat. Nos. 9,032,377 and 9,087,166. The verification processing elements can thus be integrated efficiently with the circuit processing elements of the design to which the assertions are to be applied. As explained in U.S. Pat. Nos. 9,032,377 and 9,087,166, the processing elements are defined and compiled in a manner that facilitates efficient parallel execution of multiple assertions by a multi-processor accelerator.

Thus, in the disclosed embodiments, a simulation processor receives a definition of a design of an integrated circuit device and at least one assertion of a property that is to be verified over the design. The processor compiles the definition into a graph of processing elements, including circuit processing elements that simulate operation of the device and a verification processing element representing each assertion that is to be verified. Each verification processing element comprises a hierarchical arrangement of at least one operator node and one or more leaf nodes corresponding to inputs of the assertion in question. In many cases, the hierarchical arrangement of a given verification processing element comprises a tree containing multiple operator nodes having respective child nodes, wherein each child node comprises either a leaf node or another operator node. Typically, multiple verification processing elements of this sort are defined, corresponding to multiple different assertions applying to the design under test, and are executed by the simulation processor in parallel and/or sequentially.

As the simulation processor (typically with the support of a parallel co-processor) executes a simulation of the design, it triggers the processing elements in the graph in a sequence of multiple, consecutive clock cycles of the simulated circuit. As part of the simulation, the processor verifies the respective property covered by each assertion by triggering execution of the corresponding verification processing element. As a result of this trigger, in each cycle, the root operator node in the verification processing element schedules and initiates execution of a new evaluation instance, referred to herein as a "thread," by its child node. In each cycle, depending on the evaluation result, a thread may fire a MATCH signal. Once it is guaranteed that no further MATCH signals will be fired, a DONE signal is fired and the thread is killed. The MATCH and DONE signals are fired from the node that owns a thread to its parent node.

The execution cycle propagates down the tree: In each clock cycle, child nodes initiate execution of threads that were scheduled by their parent node in the current or in a previous clock cycle. As noted earlier, leaf nodes are associated with assertion inputs. Based on the input value at the current cycle, a thread on a leaf node may fire MATCH and/or DONE signals.

Parent nodes respond to MATCH and DONE signals fired by their child nodes. This response may include scheduling new child threads and/or firing MATCH and/or DONE signals upwards to the parent of the parent node. Specifically, once a parent node receives a DONE signal from a child node, it instructs the child node to delete the corresponding thread. This deletion request is propagated down the tree recursively, deleting threads that are needed only to decide whether the now-dead thread should have otherwise fired MATCH/DONE signals. Thus, unnecessary expenditure of processing and memory resources is avoided.

For further enhancement of efficiency, multiple threads running concurrently on a given node, which share a common creation time (as explained below in detail), can be executed together and report collectively when the matching condition has been satisfied.

Thus, verification of each assertion is reported promptly and efficiently, at each clock cycle during execution of the simulation, without having to wait for the entire simulation and analysis to be completed. The disclosed implementations are readily scalable to large simulations, while enabling concurrent verification of many complex assertions.

System Description

FIG. 1 is a block diagram that schematically illustrates a system 20 for design simulation, in accordance with an embodiment of the present invention. System 20 typically performs simulation of an integrated circuit design, in order to test the design, verify its performance and identify potential design faults.

In the present example, system 20 comprises a simulation server 22, which comprises an interface 28, a central processing unit (CPU) 24, and one or more simulation coprocessors 26. Server 22 may comprise any suitable workstation or computing platform. Coprocessors may comprise, for example, multi-core processors or graphics processing units (GPUs) 32, as described in the above-mentioned U.S. Pat. No. 9,087,166. The principles of the present invention, however, are by no means limited to this sort of system and may alternatively be implemented in substantially any suitable computer simulation environment.

Server 22 interacts with a user, such as a verification engineer, via a user station 30. Server 22 receives from the user, via interface 28, a definition 32 of the design to be simulated. Definition 32 typically has the form of one or more files that are written in a hardware description language (HDL) such as VHDL or Verilog. The server also accepts, via interface 28, test-bench definitions, including assertions 34 of properties that the circuit under test is required to satisfy. The assertions are assumed, in the present embodiment, to be in the form of SystemVerilog Assertions (SVAs), but other verification languages and protocols may alternatively be used for this purpose.

Server 22 compiles definition 32 and assertions 34 to produce simulation code, and then runs the simulation code on CPU 24 and coprocessors 26. A report 36 of simulation results is provided to the user via interface 28. The report typically indicates whether or not assertions 34 were satisfied and the points in the simulation at which failures and successes occurred. These failures are used to infer suspected faults, fault locations, and other information relating to verification and debugging of the design.

Typically, CPU 24 comprises a general-purpose processor, which is programmed in software to carry out the functions described herein. The software may be downloaded to the processor in electronic form, over a network, for example, or it may, alternatively or additionally, be provided and/or stored on tangible, non-transitory media, such as magnetic, optical, or electronic memory.

Figure 2:
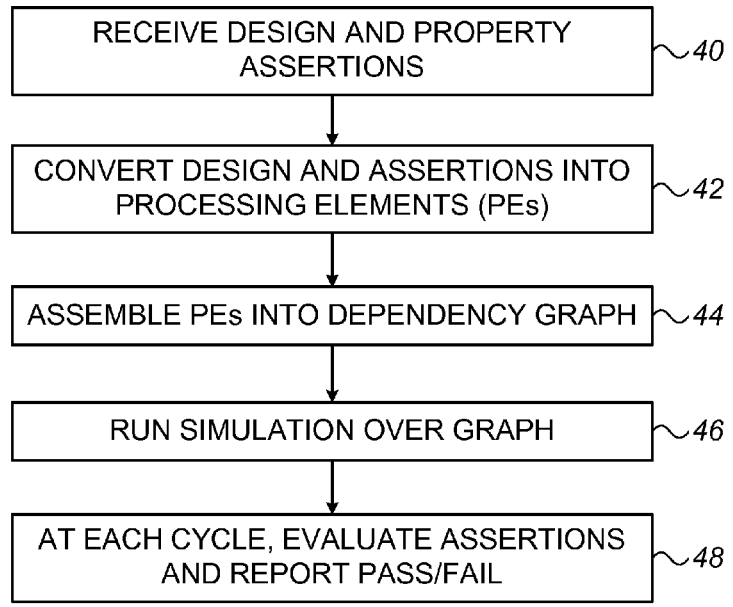
FIG. 2 is a flow chart that schematically illustrates a method for design simulation, in accordance with an embodiment of the invention.

FIG. 2 is a flow chart that schematically illustrates a method for design simulation, in accordance with an embodiment of the invention. The method is described, for the sake of convenience and clarity, with reference to the components of system 20, but the method may alternatively be implemented, mutatis mutandis, on any computer system with suitable simulation resources.

Simulation server 22 receives design definition 32 and assertions 34, at a design input step 40. Definition and assertions 34 may be input, for example, via interface 28 from user station 30 or from any other suitable source. CPU 24 converts definition 32 and assertions 34 into processing elements (PEs), at a design conversion step 42. The above-mentioned U.S. Pat. Nos. 9,032,377 and 9,087,166 explain how definitions 32 can be converted into circuit PEs, while conversion of assertions 34 into verification PEs is described further hereinbelow. Complex assertions, containing multiple operators and expressions, are converted into hierarchical graphs, also known as expression trees.

The PEs, including both the circuit and verification PEs, are together assembled into a dependency graph, at a graph assembly step 44. The dependency graph expresses the execution dependencies of the various PEs on one another, and thus indicates, inter alia, their order of processing and possible partitioning of the PEs for parallel execution (again, as described in the above-mentioned patents).

Server 22 runs the simulation, using the dependency graph, at a simulation step 46. The simulation runs over a sequence of simulated clock cycles, corresponding to actual clock cycles of the target design. At each cycle, server 22 executes the verification PEs by invoking the appropriate PE at each occurrence of the triggering event of the corresponding assertion. In response, the server receives from the root node of each verification PE (as defined below) an output of the results whenever an assertion is satisfied or fails. Server 22 evaluates these outputs and generates reports 36 to indicate whether assertions have passed or failed, at a reporting step 48. These reports may be generated and delivered both during and at the conclusion of the simulation.

Verification Processing Elements

Figure 3:
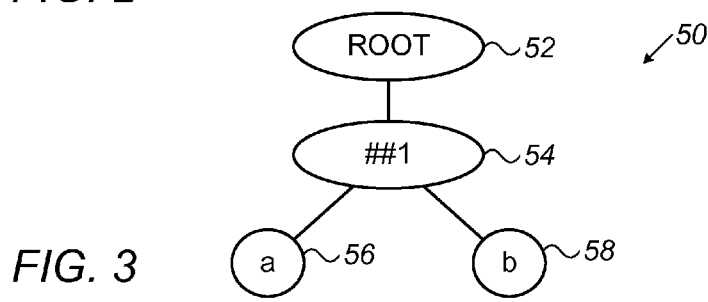
FIG. 3 is a graph that schematically represents an operator graph for execution by a verification processing element used to evaluate an assertion, in accordance with an embodiment of the invention.

FIG. 3 is a graph that schematically represents a verification processing element (PE) 50 that is used to evaluate an assertion, in accordance with an embodiment of the invention. PE 50 is a parse tree of the simple assertion: a ##1 b. Here ## is the concatenation operator, as defined by the SystemVerilog specification, while 1 represents the number of clock cycles over which the concatenation applies. The assertion means that after the variable a is high (or true), the variable b is high one cycle later.

Verification processing elements, such as PE 50, comprise three types of nodes:

A root node 52, which is invoked by the simulator at each clock cycle and maintains the current time of the simulation.

Operator nodes 54, corresponding to operations such as concatenation (##), repetition (*), and implication (|->).

Leaf nodes 56, 58, each representing an input, such as the value of a variable or the result of a single logical expression over one or more variables.

Each node has an upper interface and either zero, one, or two lower interfaces. Specifically, leaf nodes have no lower interfaces; root and unary operator nodes have a single lower interface; and binary operator nodes have two lower interfaces, referred to herein as left and right interfaces. The lower interfaces of the root and operator nodes connect to child nodes in the PE graph, and are thus also referred to herein as child interfaces; while the upper interfaces of operator and leaf nodes connect to parent nodes in the PE graph and are referred to as parent interfaces.

Figure 4:
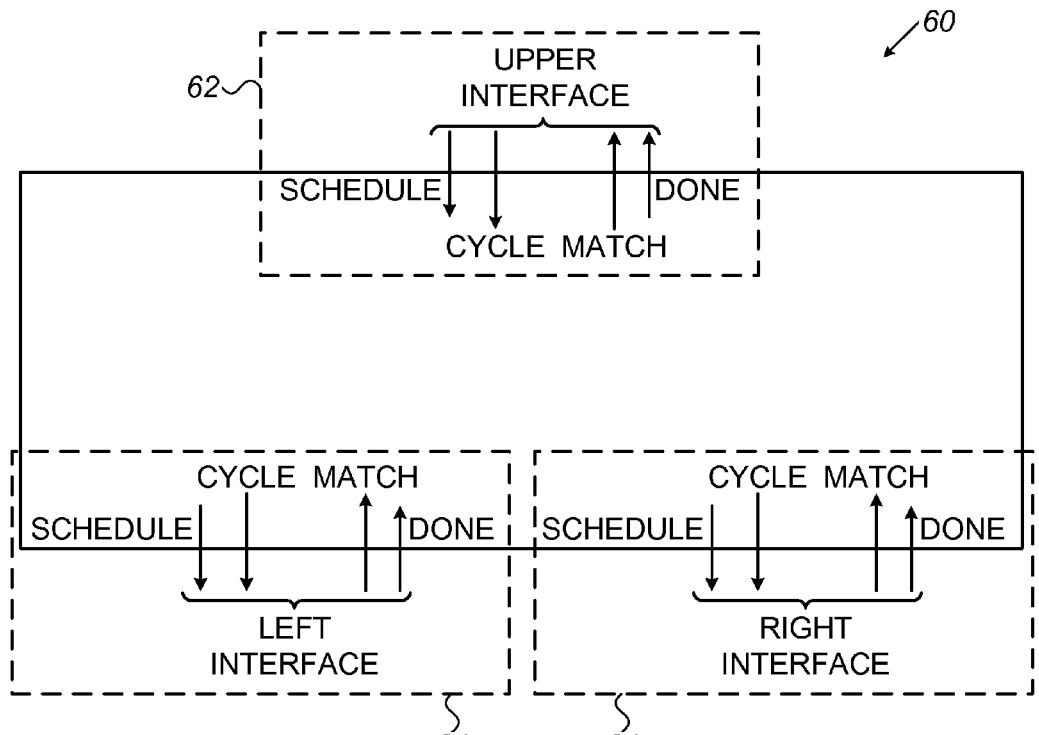
FIG. 4 is a block diagram that schematically illustrates a node in an operator graph representing an assertion, in accordance with an embodiment of the invention.

FIG. 4 is a block diagram that schematically illustrates a binary operator node 60 in a PE graph representing an assertion, in accordance with an embodiment of the invention. As noted above, node 60 comprises an upper interface 62, which links this node to a parent node, above node 60 in the hierarchical arrangement of the PE; and left and right lower interfaces 64, which link node 60 to the upper interfaces of its child nodes. Each interface 62, 64 comprises the following methods (also referred to as routines):

Schedule (start time, creation time)—called by the parent node to schedule a thread to run on the child node at a current or future time. As noted earlier, a "thread" is an evaluation instance and can typically be implemented as a state machine, with an initial state, target states, and transition logic, in response to events such as MATCH and DONE signals received from child nodes, as appropriate for the node type in question. (In some cases, the state size is not fixed and may grow and shrink dynamically.) Evaluation threads are distinct from, and should not be confused with, processing threads that may run on a processor executing the simulation. MATCH and DONE signals are sent from a child-thread in a child node to a parent-cthread (as defined below) in the parent node. The parent-cthread holds the relevant state information that may transition in response to incoming Match( ) and Done( ) calls. The parent-cthread is identified inside the parent node by its creation time, which is equal to the start_time of the child-thread. The creation_time of the child-thread is the scheduled current or future time at which the child-thread initiates execution.

Cycle (current time)—called by the parent node to instruct the child node to evaluate its threads and fire MATCH and DONE signals as appropriate for the current_time (current cycle). Multiple threads with different (creation_time, start_time) tuples can fire on each cycle. A child fires MATCH or DONE by calling the Match( ) or Done( ) method its upper interface, which is linked to the corresponding method on the lower interface of the parent. Child nodes (excluding leaves) evaluate their threads for the current cycle by scheduling (using Schedule( )) threads on their own child nodes, calling the lower interface Cycle( ) methods, and responding to incoming MATCH/DONE signals received on their lower interfaces. Leaf nodes evaluate their threads based on their associated input variables, and possibly based also on the state of the thread. cthread state information is initialized by Cycle( ) for cthreads whose scheduled creation time equals the current time.

Match (current time, reported start time, reported creation time, vacuous_success)—called by the child node to report that the logical matching condition monitored by the child node has been satisfied on a thread executing on the child node in the current clock cycle. Execution of the actual matching operation depends on the type of node. "Vacuous_success" is a flag that is false by default. The implication operator sets it true when reporting a vacuous_success implication (e.g., "a|->b," wherein a is false).

Done (current time, reported start time, reported creation time)—called by the child node to report that execution of a thread running on the child node has been terminated. Execution of this method likewise depends on the termination conditions of the given node type.

Calling the done method with respect to a given thread without reporting that the matching condition has been satisfied on the given thread indicates that the matching condition has not been satisfied with respect to the given thread.

Delete (start time, creation time) (not shown)—called by the parent node, inter alia, to kill threads that the child node has reported to be done. Once a thread is killed, its corresponding child-threads become useless and therefore they are deleted by calling Delete( ) in a recursive fashion.

By calling the schedule method through one of lower interfaces 64, operator node 60 can request that the corresponding child node schedule a thread to run at a current or future time. "Time" here refers to the running index that is incremented in each clocking event, i.e., at each clock cycle. The schedule method includes two operands: creation time (time for scheduling) and start time. The start time is the creation time of the thread in the parent node that has invoked the scheduling of the thread in the child node. The start time is used in reporting "match" or "done" by the child node. Upon receiving such a report, the parent node uses the start time information to find its own relevant thread.

A thread starts executing in the child node whenever the parent node calls the cycle method, and the current time operand of the cycle method matches the creation time of the child thread. Each node may have more than a single thread executing at any given time, but no two threads on a single node may have both the same start time and the same creation time.

Thus, referring back to FIG. 3, node 54 may give rise to multiple threads, executing concurrently. When node 58 reports a match, the report via interface 64 to node 54 will include the start time of the thread on node that found the match. In this case, the thread running on node 54 with a creation time equal to the start time of the report from node 58 will report the match via interface 62 to root node 52. When more than one thread on node 54 has this creation time, all of them will report matches via interface 62, each with its own, different start time.

Formal definitions of the above node types, including different types of operators, and the interface methods implemented by each of the nodes are presented below in Appendix A. A step-by-step analysis of simple sequence examples, based on the consecutive repetition and concatenation operators, are presented in Appendix B.

Although multiple different threads running on the same node may have the same creation time, the actual thread execution depends only on creation time, and not start time. Therefore, instead of having duplicated state machines for many threads that share the same creation time, the nodes in PE 50 execute a single thread per creation time, which is associated with a list of start times. This sort of consolidated thread is referred to herein as a cthread.

The cthread structure contains a single creation time with a list of its start times. For example, the thread (start_time=10, creation_time=11) may be included in cthread (creation time=11, start_times={9,10}). Whenever the executed cthread reports a match or done to the parent node, multiple reports are generated (each for a different start time). Whenever a new thread is scheduled, it may be added to an existing cthread when the thread creation time matches one of the cthreads, or else into a newly-allocated cthread. Adding a thread to an existing cthread means simply adding the thread start time to the start time list of the cthread.

Figure 5:
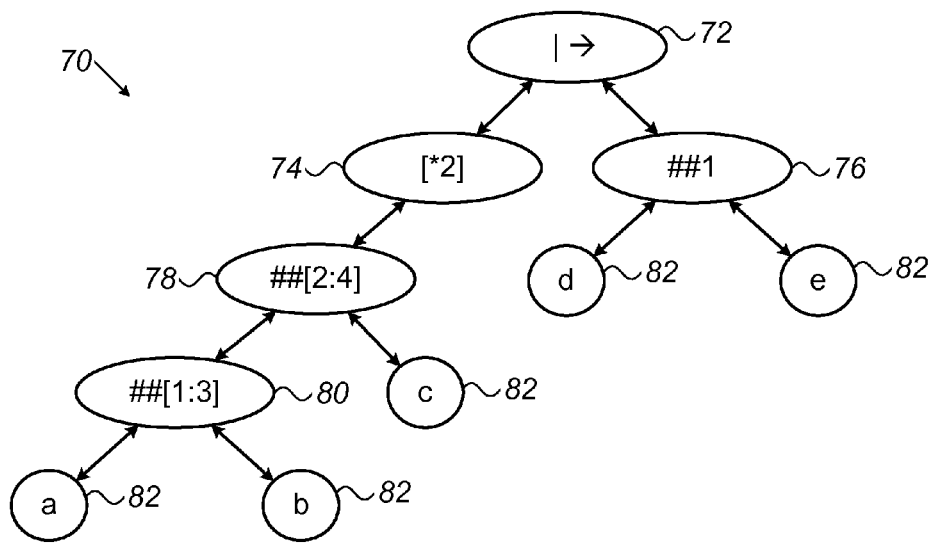
FIG. 5 is a graph that schematically represents an operator graph for execution by a verification processing element used to evaluate an assertion, in accordance with another embodiment of the invention.

FIG. 5 is a graph that schematically represents a verification processing element (PE) 70 that is used to evaluate a more complex assertion, in accordance with another embodiment of the invention. PE 70 comprises a hierarchical arrangement of operator nodes 72, 74, 76, 78, 80, each having child nodes, which comprise other operator nodes and/or leaf nodes 82. The root node is omitted for simplicity. PE 70 tests the assertion: (a ##[1:3] b ##[2:4] c) [*2]|->d ##1 e. Other complex assertions may be implemented in similar fashion.

Figure 6:
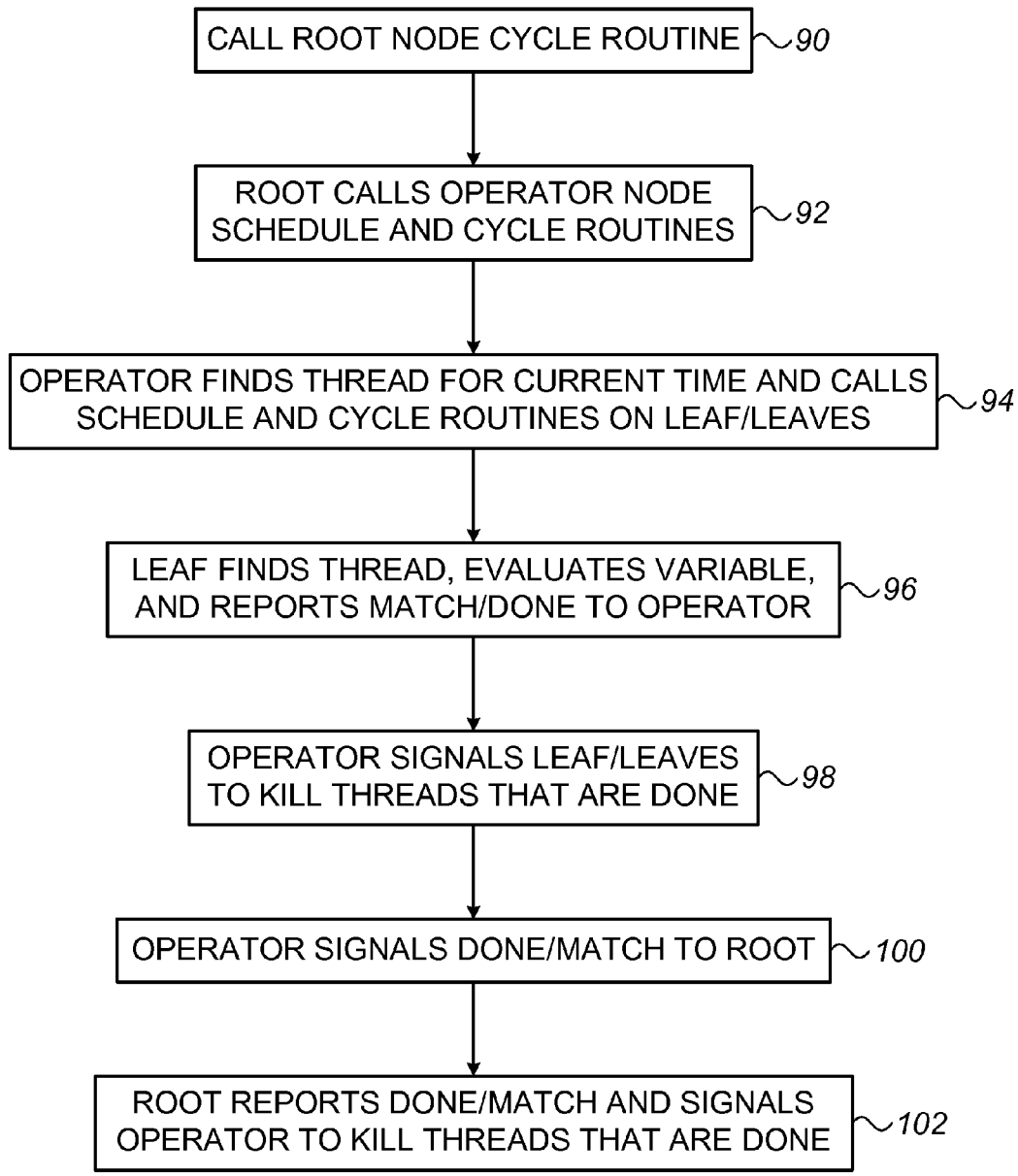
FIG. 6 is a simplified flow chart that schematically illustrates a method for testing an assertion, in accordance with an embodiment of the invention.

FIG. 6 is a flow chart that schematically illustrates a method for testing an assertion, in accordance with an embodiment of the invention. The method is described here in the abstract, with reference to the simple PE 50 that is shown in FIG. 3, but can readily be extended to more complex assertions, such as that illustrated by PE 70. Specific examples of the operation of this method are presented below in Appendix B.

At each clock cycle of the design under test by the simulator process running on server 22, the simulator calls the cycle method of root node 52, at a root cycling step 90. In response to the new clock cycle, root node 52 calls the schedule and cycle methods of operator node 54, at an operator cycling step 92. The schedule method, as explained above, creates new threads to run on operator node 54, while the cycle method triggers execution of all existing threads.

In response to the cycle method, operator node 54 searches for an active thread, at an operator activation step 94. Upon finding a thread, the operator node runs the thread, which results in calling the schedule and cycle methods of leaf node 56. Leaf node 56 similarly searches for an active thread of its own, at a leaf activation step 96. Upon finding the thread, the leaf node evaluates the value of the variable "a" at the current clock cycle. If the value is true, leaf node 56 reports a match to operator node 54. Whether the value of a is true or false, leaf node 56 reports to operator node 54 that its current thread is done, since the simple logical task of evaluating the variable in the current cycle has been completed. Operator node 54 responds by instructing leaf node 56 to kill any threads that are done, at a termination step 98, in order to avoid the burden of maintaining unneeded threads in subsequent cycles.

Although the above description of steps 94-98 referred only to interaction between operator node 54 and left leaf node 56, a similar interaction will take place between operator node 54 and right leaf node 58 in the event that leaf node 56 reported a match in the previous cycle. In this case, operator node 54 will similarly call the schedule and cycle methods of leaf node 58 at step 94, which will respond by finding its own thread, evaluating variable "b", and reporting match and/or done back to node 54 at step 96. Operator node 54 will then instruct leaf node 58 to kill any threads that are done at step 98. Unlike most other operator nodes, root nodes kill child-threads when the child thread reports a match. Thus, assertion properties report success on their first (and only) match.

In similar fashion, after receiving the reports from leaf nodes 56 and 58 at step 96, operator node 54 evaluates its own threads and reports match and/or done conditions to root node 52, at an operator reporting step 100. (Parent nodes do not necessarily wait for their child nodes to fire all signals, and may rather start reporting to their own parent nodes as soon as there are results to report.) As noted earlier, a "done" report from the operator node in a given clock cycle without a match means that the assertion has failed. In the present example, in which operator node 54 represents the concatenation a ##1 b, reporting done without a match means that the corresponding thread on the operator node found a to be false or that a was found to be true in a previous clock cycle without b being true in the current clock cycle. Root node 52 reports the result to the simulator, at a result reporting step 102. At this stage, if the assertion has failed, the simulator may immediately report the failure to the user, for example by conveying a suitable report 36 to user station 30. Alternatively or additionally, assertion results may be logged and reported at a later time.

Although the description above and in the appendices below relates to certain specific operator types and expressions, the techniques described herein can be extended to incorporate evaluation of substantially any suitable sub-expression using other (optimized) techniques, as long as the sub-expressions support the interface methods described above. Specifically, such sub-expressions should respond to Cycle( ) calls with MATCH/DONE signals. Such alternative sub-expressions may be incorporated in the operator graph by replacing the corresponding sub-tree in the graph with a "special leaf node" that is evaluated internally using a different (optimized) technique.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

Appendix A—Node Types And Methods

Root Node

PE execution for each assertions is started, in each cycle, by the root node calling the cycle method. The root node maintains the variable current_time and increments this variable on each call to cycle.

The following pseudocode defines the methods of the root node:

```
Schedule( ) - not implemented for Root node
Cycle( )
{
    this->current_time++; // increment current_time
    call schedule routine for lower interface(current_time,
current_time);
    call cycle routine for the lower
interface(current_time);
}
Match(current_time, reported_start_time,
reported_creation_time, vacuous_success)
{
    Report toward simulation for a match with above
information
    Do cleanup by calling child's delete routine // unlike
other nodes the root node can fire MATCH only once per
thread.
}
Done(current_time, reported_start_time,
reported_creation_time)
{
    In case Match was not reported, report failure toward
the simulation
    Do cleanup by calling delete routine
}
```

Leaf Node (Input Node)

As described above, a leaf node checks values of a variable or other logical expression and issues a "match" when the expression is true. Thereafter it should report "done." Reporting done without a previous match report means the logical expression is false for the current cycle.

The following pseudocode defines the methods of the leaf node:

```
Schedule(start_time, creation_time)
{
    Add a new thread with start_time and creation_time to
node database
}
Cycle(current_time)
{
    If cthread is scheduled to current_time:
    {
        Get logic expression value for node
        If logic expression value is True:
        {
            Call parent Match method for all different start
times in cthread list
        }
        Call parent done method for all different start time
in cthread list
    }
}
```

Operator Nodes

The description that follows provides implementations of three operator types. Each implementation comprises pseudocode for the Schedule( ), Cycle( ), Match( ), and Done( ) methods. Match( ) and Done( ) are treated differently depending on whether they are called via the left or right interface. Accordingly, we use MatchLeft( ), MatchRight( ), DoneLeft( ), and DoneRight( ) to differentiate between these cases. These implementations are brought as examples. Other SVA operators can be implemented in a similar fashion.

Concatenation Node

This operator schedules a new thread on its left child node in every cycle (for the same cycle) and propagates the Cycle( ) method to its child nodes. Whenever the operator receives a match from its left child node, it schedules a new thread to run on the right child node, with a delay (in cycles) that is set according to the operator delay. Upon receiving a match from the right child node, the concatenation operator reports a match to its parent node. The concatenation operator reports done if a done report has been received from its left child node, and the number of reported matches from the left child node is equal to the number of done reports from the right child node.

The following pseudocode defines the methods of the concatenation operator node:

```
Schedule(start_time, creation_time)
{
    Add a new thread with start_time and creation_time to
node database
}
Cycle(current_time)
{
    If cthread is scheduled to current_time:
    {
        // Initialize the cthread state information
        cthread->number_of_match_left_calls=0;
        cthread->number_of_done_right_calls=0;
        cthread->left_sequence_is_done= False;
```

```
    Call Schedule routine for left interface
(current_time, current_time);
  }
  // propagate down cycle...
  Call cycle for left interface (current_time);
  Call cycle for right interface (current_time);
}
MatchLeft(current_time, reported_start_time,
reported_created_time, vacuous_success)
{
  Get cthread using reported_start_time
  cthread->number_of_match_left_calls++;
  Call Schedule routine for the right interface
(reported_start_time, current_time + cycle_delay_value*);
  *NOTE: cycle_delay_value is m for the operation ##m
}
DoneLeft(current_time, reported_start_time,
reported_creation_file)
{
  Get cthread using reported_start_time
  cthread->left_sequence_is_done= True;
  send delete command to left node thread
  // report done only whenever got done from right node
  for every match from left node
  If (cthread->number_of_match_left_calls ==
        cthread->number_of_done_right_calls)
  {
    Report done to parent node (current_time,
reported_start_time) and start times in cthread list
  }
}
MatchRight(current_time, reported_start_time,
reported_creation_time, vacuous_success)
{
  Get cthread using reported_start_time
  report match for parent node (current_time,
reported_start_time) and start times in cthread list
}
DoneRight(current_time, reported_start_time,
reported_creation_time)
{
  Get cthread using reported_start_time
  send delete command to right node thread
  cthread->number_of_done_right_calls++;
  // report done only whenever got done from right node
  for every match from left node
  If ((cthread->number_of_match_left_calls ==
        cthread->number_of_done_right_calls) &&
      (cthread->left_sequence_is_done==True))
  {
    Report done to parent node (current_time,
reported_start_time) and start times in cthread list
  }
}
```

Consecutive Repetition Node

For the sake of simplicity, this description will start by limiting this node to cases wherein the child node of this repetition node fires at most one match per thread.

The repetition operator node ([*m]) schedules a new thread on its single child node in every cycle (for the same cycle) and propagates the cycle to its child node. Whenever the repetition operator node receives a match from its child, it increments the match counter of the appropriate cthread. If the counter value is below the consecutive repeat value m, the repetition operator schedules a new child thread for the next cycle. Otherwise (i.e., counter equals the consecutive repeat value), the repetition operator reports a match to its parent followed by done. Upon receiving a done report from its child before the match counter reaches m, the repetition operator node reports done to its parent.

The following pseudocode defines the methods of the (limited) repetition operator node:

```
Schedule(start_time, creation_time)
{
  Add a new thread with start_time and creation_time to
node database
}
Cycle(current_time)
{
  If cthread is scheduled to current_time:
  {
    // Initialize the cthread state information
    cthread->number_of_consecutive_matches_so_far = 0;
    Call Schedule routine for bottom interface
(current_time, current_time);
  }
  // propagate down cycle...
  Call cycle for bottom interface (current_time);
}
Match(current_time, reported_start_time,
reported_cration_time, vacuous_success)
{
  Get cthread using reported_start_time
  cthread->number_of_consecutive_matches_so_far++;
  if (cthread->number_of_consecutive_matches_so_far <
      consecutive_repeat_value*)
  {
    Call schedule routine for bottom interface
(reported_start_time, current_time+1)
  }
  else
  {
    Report match to parent node (current_time,
reported_start_time) and start times in cthread list
    Report done to parent node (current_time,
reported_start_time) and start times in cthread list
  }
}
*NOTE: consecutive_repeat_value is m for the operation
[*m]
Done(current_time, reported_start_time,
reported_creation_time)
{
  Delete child node (reported_start_time,
reported_creation_time)
  Get cthread using reported_start_time
  If (cthread->number_of_consecutive_matches_so_far <
      consecutive_repeat_value*)
  {
    Report done to parent node (current_time,
reported_start_time) and start times in cthread list
  }
}
```

The implementation becomes more complicated when the limitation of at most one match per thread at the bottom interface is removed. Consider the following example: "a" is true for 3 consecutive clock cycles, during which the following SVA expression is being evaluated:

(a [*1:2]) [*3]

Below is the corresponding operator-node graph:
ROOT
|
[*3] ←We focus at this repetition node
|
[*1:2] ←Each thread in this child node may fire
| up to 2 MATCH-es before it is DONE.
a
Cycle: 0 1 2
  a: 1 1 1

Operator [*m] builds a chain of (up to) m links, in which each link is a thread in its child node from its creation time and until it fires MATCH; the next link starts exactly one cycle after the previous link ends. In the limited version described earlier, cthreads kept track of their current chain length (number of links) using a simple integer (cthread->number_of_consecutive_matches_so_far). This expedient is no longer possible.

We will focus now on the cthread created at cycle 0 in the above [*3] operator node:

Cycle 0:

A match is reported by the child node because a is high for one cycle starting from cycle 0. This match of the child node forms the first link in the cthread chain.

Cycle 1:

A match is reported by the child node because a is high for one cycle starting from cycle 1. This match forms the second link in the cthread chain.

Another match is reported by the child node because a is high for two consecutive cycles starting from cycle 0. This match forms the first link in another chain in the same cthread.

Thus, the two consecutive "1" values of "a" so far result in two different chains:

"1"+"1" ➔ A chain of length 2 (two links)
"11" ➔ A chain of length 1 (one link)

Cycle 2:

Similarly, using the above shorthand, the cthread in question now has 3 different chains:

"1"+"1"+"1" ➔ Chain length=3
"1"+"11" ➔ Chain length=2
"11"+"1" ➔ Chain length=2

For a cthread keep to track of its chain lengths, using a set (or list) of lengths is not good enough: Not all of the chain lengths in the set should be incremented in the event of an incoming match whose reported_start_time equals the cthreads creation_time. It is also necessary to specify the conditions for adding a new length to the set. These problems are solved by differentiating incoming match reports based on their reported_creation_time (in addition to their reported_start_time which selects the cthread in the parent node). Instead of a list of lengths, each cthread holds a map that maps: reported_creation_time ➔ {set of chain lengths}.

Upon an incoming match, the limited version described earlier calls schedule (reported_start_time, current_time+1) when counter <m. Similarly, the more complex implementation performs this test (chain length <m) for each of the chain lengths (incremented by 1 due to the incoming match) in the set corresponding to the reported_creation_time. If the test returns true, schedule (reported_start_time, current_time+1) is called (but not more than once per current_time), and "creation_time=current_time+1 ➔ {current_chain_length*}" is attempted to be added to the map. If creation_time is already mapped into a {set of chain lengths}, current_chain_length is added to the existing {set of chain lengths}. Thus, later, when a match is fired for creation_time=current_time+1, it will have its up-to-date {set of chain lengths}. In the above description, {current_chain_length} is a set comprising a single item: the current (incremented) chain length from the set being iterated.

The following pseudocode defines the methods of the full (complex) implementation of the repetition operator node:

```
Schedule(start_time, creation_time)
{
    Add a new thread with start_time and creation_time to
node database
}
Cycle(current_time)
{
    If cthread is scheduled to current_time:
    {
```

```
        // Initialize the cthread state information
        // map: child_creation_time -> {set of chain lengths}
        Initialize cthread->map (empty)
        Add (current_time -> {0}) to map
        cthread->last_time_this_cthread_fired_match = NEVER
        cthread->number_of_child_threads = 1 // Scheduled in
the next line.
        Call Schedule routine for bottom interface
(current_time, current_time);
    }
    // propagate down cycle...
    Call cycle for bottom interface (current_time);
}
Match(current_time, reported_start_time,
reported_cration_time, vacuous_success)
{
    Get cthread using reported_start_time
    // Will point to set of chain length for
current_time+1.
    p = NULL
    Find set that is mapped to reported_creation_time via
cthread->map.
    foreach chain_length in set
    {
        incremented_chain_length = chain_length + 1
        if (incremented_chain_length <
consecutive_repeat_value*)
        {
            if (current_time+1 is not a key in cthread->map)
            {
                cthread->number_of_child_threads++
                Call schedule routine for bottom interface
(reported_start_time, current_time+1)
            }
            p = set in cthread->map for (current_time+1). If
(current_time+1) is not mapped, map it to a new empty
set.
            add incremented_chain_length to *p
        }
        else
        {
        // It is possible that we already called
Match(current_time, reported_start_time, ...)
        // due to another thread (different
reported_creation_time).
        // For example: (a[*1:2]) [*2]
        //
        // cycle: 0 1 2
        //    a: 1 1 1
        //
        // At current_time (cycle) 2, node [*2] would get two
MatchLeft( ) calls:
        //  - MatchLeft(2, 0, 1): "1" + "11" reporting MATCH
for the "11", and
        //  - MatchLeft(2, 0, 2): "11" + "1" reporting MATCH
for the "1".
        //
            if (cthread->last_time_this_cthread_fired_match ==
current_time)
                continue;
            cthread->last_time_this_cthread_fired_match =
current_time
            Report match to parent node (current_time,
reported_start_time) and start times in cthread list
        }
    }
}
*NOTE: consecutive_repeat_value is m for the operation
[*m]
Done(current_time, reported_start_time,
reported_creation_time)
{
    Delete child node (reported_start_time,
reported_creation_time)
    Get cthread using reported_start_time
    cthread->map->delete(entry for
key=reported_creation_time)
    If (--cthread->number_of_child_threads == 0)
    {
```

```
    Report done to parent node (current_time,
  reported_start_time) and start times in cthread list
    }
  }
}
```

Implication Node

The following description of the implication operator node uses the term "vacuous success" to mean that the antecedent of the implication (the left child node) has no match.

The implication operator node schedules a new thread on its left child node in every cycle (for the same cycle) and propagates the cycle to its child nodes.

Upon receiving a match from its left child node, the operator increments the number of left matches and schedules a new thread on the right child node with a creation time of current time, in the case of overlapped implication (|->), or current time +1, in the case of non-overlapped implication (|=>). Upon receiving a done report from the left child node, the operator reports one of the following to its parent:

a) Vacuous success—when there has been no previous report of a match from the left child node;

b) Success—when there have been one or more previous match reports from the left child node, and the number of previous match reports from the left child node is equal to the number of previous first-match* reports from the right child node; or c) Nothing—when there have been one or more previous match reports from the left child node, the number of previous first-match* reports from the right child node is not yet equal to the number of previous match reports from left child node, and there are still (one or more) running right child threads that may send new first-match reports.

Upon receiving a done report from the right child node that is not preceded by a match from the same node, the implication operator reports failure (by sending done without a match).

Upon receiving a match report from the right child node, if the corresponding left child thread is done, and the number of previous match reports from the left child node is equal to the number of first-match reports from the right child, then the implication operator reports success (match and then done) to its parent.

> Unlike most other operators, the implication operator kills (using Delete( )) its right child threads once they send a match signal. Therefore, the implication operator receives only the first match from its right child threads.

The following pseudocode defines the methods of the implication operator node:

```
    Schedule(start_time, creation_time)
    {
      Add a new thread with start_time and creation_time to
    node database
    }
    Cycle(current_time)
    {
      If cthread is scheduled to current_time:
      {
        // Initialize the cthread state information
        cthread->number_of_match_left_calls = 0;
        cthread->number_of_right_first_matches = 0;
        cthread->left_sequence_is_done = False;
        Call Schedule routine for left interface
    (current_time, current_time);
      }
      // propagate down cycle...
      Call cycle for left interface (current_time);
      Call cycle for right interface (current_time);
    }
    MatchLeft(current_time, reported_start_time,
    reported_creation_time, vacuous_success)
    {
      Get cthread using reported_start_time
      cthread->number_of_match_left_calls++;
      // overlapped implication:    |->
      // nonoverlapped implication: |=>
      cycle_delay = overlapped_implication ? 0 : 1;
      Call schedule routine for right interface
    (reported_start_time, current_time+cycle_delay)
    }
    DoneLeft(current_time, reported_start_time,
    reported_creation_time)
    {
      Get cthread using reported_start_time
      If (cthread->number_of_match_left_calls == 0)
      {
        Report vacuous success match to parent node
    (current_time, reported_start_time) and start times in
    cthread list
        Report done toward parent node (current_time,
    reported_start_time) and start times in cthread list
      }
      Else
      {
        If (cthread->number_of_match_left_calls ==
            cthread->number_of_right_first_matches)
        {
          Report match to parent node (current_time,
    reported_start_time) and start times in cthread list
          Report done to parent node (current_time,
    reported_start_time) and start times in cthread list
        }
        Else
        {
          cthread->left_sequence_is_done = True
          left_child_node->Delete(reported_start_time,
    reported_creation_time)
        }
      }
    }
    MatchRight(current_time, reported_start_time,
    reported_creation_time, vacuous_success)
    {
      Get cthread using reported_start_time
      If ((cthread->number_of_match_left_calls ==
           ++cthread->number_of_right_first_matches) &&
          (cthread->left_sequence_is_done))
      {
        Report match to parent node (current_time,
    reported_start_time) and start times in cthread list
        Report done to parent node (current_time,
    reported_start_time) and start times in cthread list
      }
      Else
      {
        // Delete right child thread on first match.
        Right_child_node->Delete(reported_start_time,
    reported_creation_time)
      }
    }
    DoneRight(current_time, reported_start_time,
    reported_creation_time)
    {
      // MatchRight( ) delete the caller's cthread before it
    reports done.
      // We get here when the child reports done without a
    match.
      // That is, not all of the antecedent's matches have a
    corresponding consequent match.
      // In this case, the implication shall fail (report
    done without a match).
```

```
Get cthread using reported_start_time
Report done to parent node (current_time,
reported_start_time) and start times in cthread list
}
```

Appendix B

A Step-by-Step Analysis of Simple Sequence Examples

Consecutive Repetition Operator

As an example, we examine the sequence s1=a[*1:3] (the operator [*1:3] reports a match when a is high on 1-3 consecutive clock cycles starting from the reported start time). The sequence expression is represented by the following PE graph:

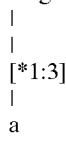

We assume the following data pattern in order to follow the threads of the above [*1:3] node:
Cycle: 0 1 2 3 4 5 6 7 8
a: 0 0 1 1 0 0 0 0 0

Note that the same thread (e.g., the one created at cycle 2) can issue a MATCH more than once. Moreover, different threads can issue a MATCH on the same cycle (e.g., cycle 3 below).
Cycle 0:
A new thread for start_time=0 begins and is DONE (closed) immediately because a(0)=0.
Cycle 1:
A new thread for start_time=1 begins and is DONE immediately because a(1)=0.
Cycle 2:
A new thread for start_time=2 begins.
A MATCH is issued for start_time=2 (a is high for 1 clock).
Cycle 3:
A new thread for start_time=3 begins.
A MATCH is issued for start_time 2 (a is high for 2 consecutive clocks).
A MATCH is issued for start_time 3 (a is high for 1 clock).
Cycle 4:
A new thread for start_time=4 begins and is DONE (closed) immediately because a(4)=0.
The thread for start_time=2 is DONE (a is no longer high).
The thread for start_time=3 is DONE (a is no longer high).

Concatenation Operator

The following example refers to PE 50, as shown in FIG. 3. It illustrates, inter alia, the distinction between creation time and start time of threads executed by nodes 54, 56, 58 and the handling of multiple concurrent threads. Child nodes 56 and 58 are referred to hereinbelow as s1 and s2, respectively. As in the example shown in the figure, s2=b, but for the sake of the present illustration, node 56 is itself an operator node, which represents the expression s1=a[*1:2].

The values of the variables a and b over three clock cycles are assumed to be as follows:
Cycle: 0 1 2
a: 1 1 0
b: 0 0 1
Cycle 0:
1: A new thread for start_time=0 begins.
Once s1 issues the match for start_time=0 (in this cycle), a new thread is scheduled to be created on s2 in the next cycle (start_time=0, creation_time=1).
s1: A new thread for start_time=0 begins (created by the parent ##1, with creation_time==start_time=0). A MATCH is issued for start_time 0 (a is high for 1 clock).
s2: No thread begins (s1 did not issue a "match" in the previous cycle).
Threads in This Cycle:
(start_time, creation_time) [M=MATCH] [D=DONE] [S=SCHEDULED FOR FUTURE CREATION]
1: (0,0)
s1: (0,0) M
s2: (0,1) S
Cycle 1:
1: A new thread for start_time=1 begins. Once s1 issues the match from start_time=0 (in this cycle), a new thread is scheduled to be created on s2 in the next cycle (start_time=0, creation_time=2). Once s issues the match for start_time=1 (in this cycle), another new thread is scheduled to be created on s2 in the next cycle (start_time=1, creation_time=2).
s1: A new thread for start_time=1 begins (created by the parent ##1, with creation_time==start_time=1). A MATCH is issued for start_time=0 (a is high for 2 consecutive clocks). This thread (start_time=0) is DONE (reached 2 consecutive matches, the maximum). A MATCH is issued for start_time=1 (a is high for 1 clock).
s2: A previously scheduled thread is now created (start_time=0, creation_time=1). It is DONE immediately because b(1)=0.
Threads in This Cycle:
(start_time, creation_time) [M=MATCH] [D=DONE] [S=SCHEDULED FOR FUTURE CREATION]
1: (0,0)
(1,1)
s1: (0,0) M D
(1,1) M
s2: (0,1) D
(0,2) S
(1,2) S
Cycle 2:
1: A new thread for start_time=2 begins. It ends (DONE) now because the corresponding thread on s1 (see "s1:" below) is done without a match. The start_time=0 thread ends with a MATCH and DONE following the signals from s2 in this cycle (both s1 and s2 issued MATCH and DONE for start_time=0). The start time=1 thread ends with a MATCH and DONE following the signal from s2 in this cycle (both s1 and s2 issued MATCH and DONE for start time=1).
s1: A new thread (creation_time=start_time=2) begins and is DONE immediately because a(2)=0. The thread that started at time 1 is DONE (end of consecutive matches after 1 cycle).
s2: A previously scheduled thread is now created (start_time=0, creation_time=2). This thread issues a MATCH and is DONE now (simple Boolean expression: "b"). A previously scheduled thread is now created (start_time=1, creation_time=2). This thread issues a MATCH and is DONE now (simple Boolean expression: "b").

Threads in This Cycle:
(start_time, creation_time) [M=MATCH] [D=DONE] [S=SCHEDULED FOR FUTURE CREATION]
1: (0,0) M D
 (1,1) M D
 (2,2) D
s1: (1,1) M D
 (2,2) D
s2: (0,2) M D
 (1,2) M D Aggregating Multiple Start_Times Per Creation_Time:

In cycle 2 above, s2 has two threads that share the same creation_time (2), but have different start_times (0 and 1). These two threads started at the same time in the same initial state, and they respond to the same inputs (in this case: b). Therefore, they would produce the same MATCH/DONE outputs except for the different reported start_times. These threads will thus be consolidated in the cthread (creation_time=2, start_times={0,1}).

The invention claimed is:

1. A method for design verification, comprising:
receiving a definition of a design of an integrated circuit device and at least one assertion of a property that is to be verified over the design;
compiling the definition into a graph of processing elements, including first processing elements that simulate operation of the device and at least one second processing element representing the at least one assertion, the at least one second processing element comprising a hierarchical arrangement of at least one operator node and one or more leaf nodes corresponding to inputs of the at least one assertion;
executing, on a processor, a simulation of the design by triggering the processing elements in the graph in multiple, consecutive clock cycles; and
evaluating the property by performing on the processor, during execution of the simulation:
initiating, by the at least one operator node in each clock cycle in a sequence of the clock cycles, one or more threads for execution by at least one of the leaf nodes;
executing the threads in each clock cycle, by the at least one of the leaf nodes, in order to evaluate a matching condition over the inputs;
reporting in each clock cycle, from the at least one of the leaf nodes to the operator node, results of executing the threads in the clock cycle; and
based on the results reported by the at least one of the leaf nodes, generating an output from the at least one operator node in each clock cycle, indicating whether at least one assertion was satisfied.

2. The method according to claim 1, wherein the at least one operator node corresponds to at least one operator, selected from a group of operators consisting of a concatenation operator, a repetition operator, and an implication operator.

3. The method according to claim 1, wherein the hierarchical arrangement comprises a tree containing multiple operator nodes having respective child nodes, each child node comprising either a leaf node or another operator node.

4. The method according to claim 1, wherein the at least one operator node comprises an upper interface, which links the at least one operator node to another node above the at least one operator node in the hierarchical arrangement, and at least one child interface, which links the at least one operator node to an upper interface of a respective child node, and
wherein each of the upper and child interfaces comprises a match method, and wherein reporting the results comprises calling the match method to report, via the upper interface of the child node, that the matching condition has been satisfied on at least one of the threads executing on the child node in a given clock cycle.

5. The method according to claim 4, wherein each of the upper and child interfaces comprises a schedule method, and wherein initiating the one or more threads comprises calling the schedule method by the at least one operator node in order to schedule a thread to run on the child node.

6. The method according to claim 5, wherein calling the schedule method comprises scheduling multiple, different threads with respective creation times to run concurrently on the child node, wherein a plurality of the threads have a common creation time and together report when the matching condition has been satisfied.

7. The method according to claim 5, wherein calling the schedule method comprises invoking the schedule method multiple times by multiple, different parent threads, running on the at least one operator node and having respective creation times, thereby causing multiple child threads to run concurrently on the child node, and wherein the child threads have respective start times corresponding to the respective creation times of the parent threads.

8. The method according to claim 4, wherein each of the upper and child interfaces comprises a done method, and wherein reporting the results comprises calling the done method to report, via the upper interface of the child node, that execution of at least one of the threads running on the child node has been terminated.

9. The method according to claim 8, wherein calling the done method with respect to a given thread without reporting that the matching condition has been satisfied on the given thread indicates that the matching condition has not been satisfied with respect to the given thread.

10. The method according to claim 8, and comprising, in response to execution of the done method by the child node, instructing the child node, via the upper interface of the child node, to kill the given thread, thereby invoking a recursive process of killing multiple threads that propagates down through the graph.

11. Apparatus for design verification, comprising:
an interface, which is coupled to receive a definition of a design of an integrated circuit device and at least one assertion of a property that is to be verified over the design; and
a processor, which is configured to compile the definition into a graph of processing elements, including first processing elements that simulate operation of the device and at least one second processing element representing the at least one assertion, the at least one second processing element comprising a hierarchical arrangement of at least one operator node and one or more leaf nodes corresponding to inputs of the at least one assertion,
wherein the processor is configured to execute a simulation of the design by triggering the processing elements in the graph in multiple, consecutive clock cycles, and to evaluate the property by performing on the processor, during execution of the simulation:

initiating, by the at least one operator node in each clock cycle in a sequence of the clock cycles, one or more threads for execution by at least one of the leaf nodes;

executing the threads in each clock cycle, by the at least one of the leaf nodes, in order to evaluate a matching condition over the inputs;

reporting in each clock cycle, from the at least one of the leaf nodes to the operator node, results of executing the threads in the clock cycle; and based on the results reported by the at least one of the leaf nodes, generating an output from the at least one operator node in each clock cycle, indicating whether the at least one assertion was satisfied.

12. The apparatus according to claim 11, wherein the at least one operator node corresponds to at least one operator, selected from a group of operators consisting of a concatenation operator, a repetition operator, and an implication operator.

13. The apparatus according to claim 11, wherein the hierarchical arrangement comprises a tree containing multiple operator nodes having respective child nodes, each child node comprising either a leaf node or another operator node.

14. The apparatus according to claim 11, wherein the at least one operator node comprises an upper interface, which links the at least one operator node to another node above the at least one operator node in the hierarchical arrangement, and at least one child interface, which links the at least one operator node to an upper interface of a respective child node, and wherein each of the upper and child interfaces comprises a match method, and wherein reporting the results comprises calling the match method to report, via the upper interface of the child node, that the matching condition has been satisfied on at least one of the threads executing on the child node in a given clock cycle.

15. The apparatus according to claim 14, wherein each of the upper and child interfaces comprises a schedule method, and wherein initiating the one or more threads comprises calling the schedule method by the at least one operator node in order to schedule a thread to run on the child node.

16. The apparatus according to claim 15, wherein calling the schedule method comprises scheduling multiple, different threads with respective creation times to run concurrently on the child node, wherein a plurality of the threads have a common creation time and together report when the matching condition has been satisfied.

17. The apparatus according to claim 15, wherein calling the schedule method comprises invoking the schedule method multiple times by multiple, different parent threads, running on the at least one operator node and having respective creation times, thereby causing multiple child threads to run concurrently on the child node, and wherein the child threads have respective start times corresponding to the respective creation times of the parent threads.

18. The apparatus according to claim 14, wherein each of the upper and child interfaces comprises a done method, and wherein reporting the results comprises calling the done method to report, via the upper interface of the child node, that execution of at least one of the threads running on the child node has been terminated.

19. The apparatus according to claim 18, wherein calling the done method with respect to a given thread without reporting that the matching condition has been satisfied on the given thread indicates that the matching condition has not been satisfied with respect to the given thread.

20. The apparatus according to claim 18, wherein the processor is configured, in response to execution of the done method by the child node, to instruct the child node, via the upper interface of the child node, to kill the given thread, thereby invoking a recursive process of killing multiple threads that propagates down through the graph.

21. A computer software product, comprising a nontransitory computer-readable medium in which program instructions are stored, which instructions, when read by a computer, cause the computer to receive a definition of a design of an integrated circuit device and at least one assertion of a property that is to be verified over the design, and to compile the definition into a graph of processing elements, including first processing elements that simulate operation of the device and at least one second processing element representing the at least one assertion, the at least one second processing element comprising a hierarchical arrangement of at least one operator node and one or more leaf nodes corresponding to inputs of the at least one assertion, wherein the instructions cause the computer to execute a simulation of the design by triggering the processing elements in the graph in multiple, consecutive clock cycles, and to evaluate the property by performing on the processor, during execution of the simulation:

initiating, by the at least one operator node in each clock cycle in a sequence of the clock cycles, one or more threads for execution by at least one of the leaf nodes;

executing the threads in each clock cycle, by the at least one of the leaf nodes, in order to evaluate a matching condition over the inputs;

reporting in each clock cycle, from the at least one of the leaf nodes to the operator node, results of executing the threads in the clock cycle; and based on the results reported by the at least one of the leaf nodes, generating an output from the at least one operator node in each clock cycle, indicating whether the at least one assertion was satisfied.

* * * * *